(12) United States Patent
Nakamura

(10) Patent No.: US 7,863,707 B2
(45) Date of Patent: Jan. 4, 2011

(54) DC-DC CONVERTER

(75) Inventor: Kazutoshi Nakamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 447 days.

(21) Appl. No.: 12/121,171

(22) Filed: May 15, 2008

(65) Prior Publication Data

US 2008/0283965 A1 Nov. 20, 2008

(30) Foreign Application Priority Data

May 15, 2007 (JP) .............................. 2007-129063

(51) Int. Cl.
*H01L 21/02* (2006.01)

(52) U.S. Cl. ............... 257/532; 257/368; 257/E27.009; 438/239; 327/423

(58) Field of Classification Search ................. 257/341, 257/499, 528, 532, 368, E21.705, E27.009, 257/E27.016; 438/210, 239, 251, 394; 323/282; 327/423

See application file for complete search history.

(56) References Cited

U.S. PATENT DOCUMENTS

| 6,593,620 | B1 | 7/2003 | Hshieh et al. | |
|---|---|---|---|---|
| 6,621,327 | B2 * | 9/2003 | Kitamoto | 327/537 |
| 6,738,240 | B1 * | 5/2004 | Ahn et al. | 361/38 |
| 7,138,698 | B2 | 11/2006 | Nakamura et al. | |
| 7,170,273 | B2 * | 1/2007 | Sase et al. | 323/285 |
| 7,238,992 | B2 * | 7/2007 | Komori et al. | 257/365 |
| 7,304,463 | B2 * | 12/2007 | Noma | 323/284 |
| 7,307,462 | B2 * | 12/2007 | Cheng et al. | 327/175 |
| 7,514,731 | B2 * | 4/2009 | Shiraishi et al. | 257/288 |
| 7,579,669 | B2 * | 8/2009 | Nakamura et al. | 257/499 |
| 7,687,885 | B2 * | 3/2010 | Hashimoto et al. | 257/532 |
| 2006/0170043 | A1 * | 8/2006 | Liu et al. | 257/341 |
| 2007/0063307 | A1 | 3/2007 | Nakamura et al. | |
| 2007/0063737 | A1 * | 3/2007 | Ludikhuize et al. | 326/83 |
| 2010/0001790 | A1 * | 1/2010 | Hashimoto et al. | 327/566 |

FOREIGN PATENT DOCUMENTS

| JP | 2001-25239 | 1/2001 |
|---|---|---|
| JP | 2002-368121 | 12/2002 |
| JP | 2004-511910 | 4/2004 |
| JP | 2006-333689 | 12/2006 |

* cited by examiner

*Primary Examiner*—Thao X Le
*Assistant Examiner*—William F Kraig
(74) *Attorney, Agent, or Firm*—Oblon, Spivak, McClelland, Maier & Neustadt, L.L.P.

(57) ABSTRACT

A semiconductor device includes, in one semiconductor substrate: a plurality of switching elements connected between a terminal of an input voltage and an inductor; a driver circuit connected to a gate electrode of the switching element and driving the switching element; a reference voltage line connected to a source electrode of the switching element; a power supply line of the driver circuit; and a capacitor connected between the power supply line and the reference voltage line.

16 Claims, 11 Drawing Sheets

DC-DC CONVERTER

CROSS-REFERENCE TO RELATED APPLICATIONS

This application is based upon and claims the benefit of priority from the prior Japanese Patent Application No. 2007-129063, filed on May 15, 2007; the entire contents of which are incorporated herein by reference.

BACKGROUND OF THE INVENTION

1. Field of the Invention

This invention relates to a semiconductor device, and more particularly to a semiconductor device used for a DC-DC converter, for example.

2. Background Art

Recently, with the decreasing voltage of power supplies used for the CPU (Central Processing Unit) of computers, for example, power supplies based on synchronous rectification (e.g., step-down DC-DC converters) are widely used. Furthermore, the current change rate (di/dt) required for a CPU power supply is ever increasing, and the ripple of the output voltage of the power supply needs to be held down. To this end, increasing the switching frequency of the power supply becomes important. In addition, with the decrease of the CPU operating voltage, the CPU power supply is required to provide low voltage and large current. Thus it is desired to increase the switching frequency and efficiency of the power supply system (DC-DC converter) itself that supplies electric power.

In a step-down DC-DC converter, a MOSFET is used as a switching (chopping) element (see, e.g., JP-A 2004-511910 (Kokai)). In an on-chip DC-DC converter with built-in switching elements, if the operating current is increased, it is difficult to uniformly turn on/off the entirety of a plurality of switching elements due to the effect of interconnect resistance. In an on-chip output element, the gate-source breakdown voltage is often set lower than the drain-source breakdown voltage. Thus a driver power supply line for turning on the gate of the output element is needed besides the input voltage line and the ground line. The power supply line of a driver circuit for driving this switching element is often formed thinner and longer than the input voltage line of the converter and the ground line, and is particularly susceptible to parasitic interconnect resistance. When the switching elements are driven, the switching element located distant from the power supply of the driver circuit cannot rapidly charge/discharge the power supply line, increasing the switching time and loss at this location. Furthermore, the switching element located nearer to the power supply of the driver circuit switches earlier, whereas the switching element located distant therefrom switches later, causing current variation in the semiconductor substrate. Concentration of current on one location may lead to device destruction.

On the other hand, when a low-side built-in diode is turned on during the dead time of the DC-DC converter, electrons are injected into the semiconductor substrate. The injected electrons flow to electrodes at higher potential than GND (ground), causing malfunctions and latch-ups, which may lead to device destruction.

SUMMARY OF THE INVENTION

According to an aspect of the invention, there is provided a semiconductor device including, in one semiconductor substrate: a plurality of switching elements connected between a terminal of an input voltage and an inductor; a driver circuit connected to a gate electrode of the switching element and driving the switching element; a reference voltage line connected to a source electrode of the switching element; a power supply line of the driver circuit; and a capacitor connected between the power supply line and the reference voltage line.

According to an aspect of the invention, there is provided a semiconductor device including, in one semiconductor substrate: a plurality of switching elements connected between an inductor and a ground line; a driver circuit connected to a gate electrode of the switching element and driving the switching element; a power supply line of the driver circuit; and a capacitor connected between the power supply line and the ground line.

According to an aspect of the invention, there is provided a semiconductor device including, in one semiconductor substrate: a plurality of high-side switching elements connected between a terminal of an input voltage and an inductor; a high-side driver circuit connected to a gate electrode of the high-side switching element and driving the high-side switching element; a high-side reference voltage line connected to a source electrode of the high-side switching element; a high-side power supply line of the high-side driver circuit; a high-side capacitor connected between the high-side power supply line and the high-side reference voltage line; a plurality of low-side switching elements connected between the inductor and a ground line; a low-side driver circuit connected to a gate electrode of the low-side switching element and driving the low-side switching element; a low-side power supply line of the low-side driver circuit; and a low-side capacitor connected between the low-side power supply line and the ground line.

DETAILED DESCRIPTION OF THE INVENTION

An embodiment of the invention will now be described with reference to the drawings.

Figure 2:
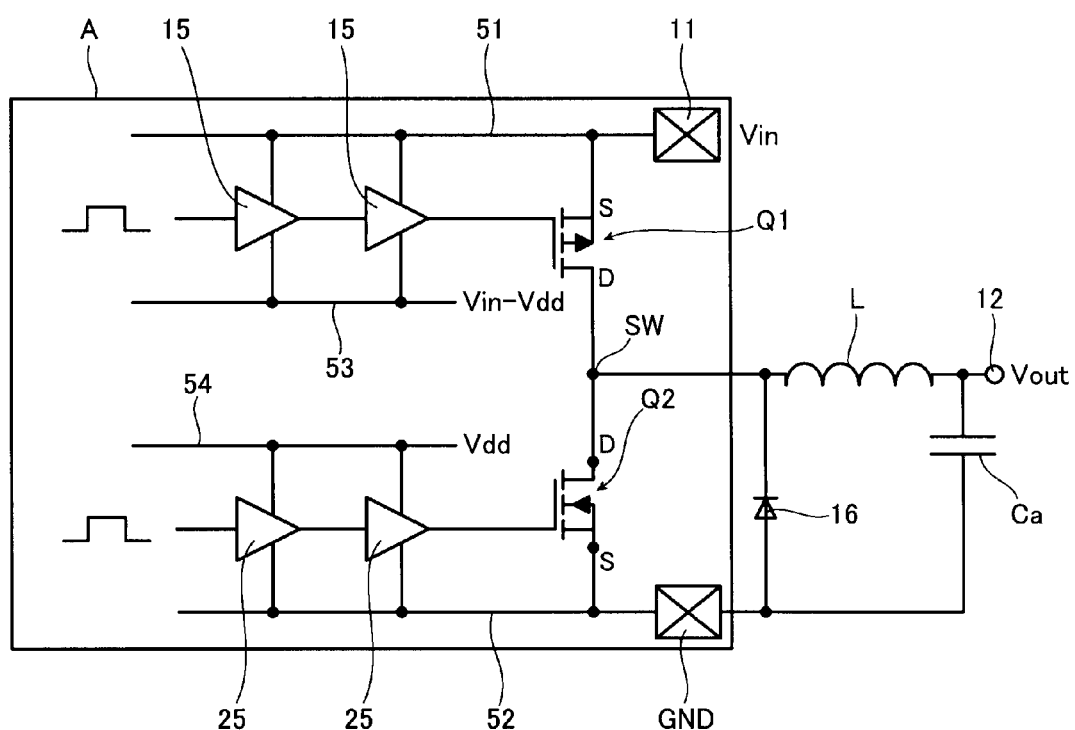
FIG. 2 is a circuit diagram illustrating the overall configuration of a DC-DC converter based on the semiconductor device according to the embodiment of the invention.

FIG. 2 is a circuit diagram illustrating the overall configuration of a DC-DC converter based on a semiconductor device according to the embodiment of the invention.

This DC-DC converter is a non-isolated step-down DC-DC converter, where an input voltage Vin is applied from an input terminal 11 and an output voltage Vout lower than the input voltage Vin is produced at an output terminal 12. The output voltage Vout stepped down from the input voltage Vin is obtained by alternately turning on/off a high-side switching element Q1 and a low-side switching element Q2. A rectangular wave is outputted to the connection node SW between the switching elements Q1, Q2 and smoothed by a filter composed of an inductor L and a capacitor Ca.

In this embodiment, the high-side switching element Q1 is a p-channel MOSFET (metal oxide semiconductor field effect transistor), and the low-side switching element Q2 is an n-channel MOSFET. The source electrode of the high-side switching element Q1 is connected to an input voltage line 51, to which the input voltage Vin is applied from the input terminal 11. The gate electrode of the switching element Q1 is connected to a driver circuit 15. The drain electrode of the switching element Q1 is connected to the drain electrode of the low-side switching element Q2.

The source electrode of the low-side switching element Q2 is connected to a ground line 52, which is connected to the ground terminal GND. The gate electrode of the switching element Q2 is connected to a driver circuit 25.

A Schottky barrier diode 16 is connected in parallel to the low-side switching element Q2. The cathode of the Schottky barrier diode 16 is connected to the drain electrode of the switching element Q2, and the anode is connected to the source electrode of the switching element Q2.

The connection node SW between the drain electrode of the switching element Q1 and the drain electrode of the switching element Q2 is connected to the output terminal 12 through the inductor L. The capacitor Ca is connected between the output terminal 12 and the ground. The inductor L and capacitor Ca constitute a low-pass filter.

To control the on/off of the switching elements Q1, Q2, gate driving signals with nearly inverted phases are supplied from the driver circuits 15, 25 to the respective gate electrodes of the switching elements Q1, Q2. If both the switching elements Q1, Q2 are simultaneously turned on, a very large current flows from the input terminal 11 through the switching elements Q1, Q2 to the ground. To avoid this, turning off the transistor Q1 is followed by a short elapsed time before turning on the transistor Q2.

The voltage ratio between the input voltage Vin and the output voltage Vout can be configured by the duty ratio of switching (chopping) at the switching element Q1. While the switching element Q1 is turned on, a current flows through the switching element Q1 to the inductor L, where energy is accumulated. During the time from the turn-off of the switching element Q1 to the turn-on of the switching element Q2, the energy accumulated in the inductor L (back electromotive force) causes a flywheel current to flow from the ground through the Schottky barrier diode 16.

The phases at which the switching elements Q1, Q2 are turned on/off are configured so that, strictly, there is a short period in which both of them are turned off. This is intended for avoiding a period in which the switching elements Q1 and Q2 are short-circuited. However, during the period in which the switching elements Q1 and Q2 are both turned off (dead time), the built-in body diode, which is structurally included in the switching element Q2 as a parasitic element, is typically turned on. The forward voltage drop of this built-in body diode is greater than the on-voltage of the switching element Q2.

Hence the Schottky barrier diode 16 is connected in parallel between the source and the drain of the switching element Q2. Thus the source-drain voltage of the switching element Q2 can be effectively reduced during the dead time. More specifically, during the dead time, the built-in body diode of the switching element Q2 is prevented from being turned on, allowing a current to flow through the Schottky barrier diode 16 having a lower forward voltage drop. However, this Schottky barrier diode 16 is not constitutionally essential, and is often desired to be omitted from the viewpoint of reducing the number of components.

To achieve fast operation, it is important to minimize parasitic inductance. Thus, to reduce parasitic inductance, the high-side switching element Q1, the associated driver circuit 15, the low-side switching element Q2, and the associated driver circuit 25 are formed not discretely, but on the same semiconductor substrate (semiconductor chip). That is, the portion enclosed by the solid line A in FIG. 2 is formed on the same semiconductor substrate.

The switching elements Q1, Q2 and the driver circuits (e.g. CMOS in this embodiment) 15, 25 are formed on the same semiconductor substrate. From the viewpoint of process simplification by avoiding the formation of two types of gate oxide films, the gate oxide film used for the switching elements Q1, Q2 are the same as those for the driver circuits (CMOS) 15, 25. Hence, in the switching elements Q1, Q2, the relation of [drain-source voltage]>[gate-source voltage] holds. If the input voltage Vin>|gate-source voltage|, the input voltage Vin or the ground potential cannot be applied to the gate of the switching elements Q1, Q2. Hence power supply lines 53, 54 of the driver circuits 15, 25 for turning on the gate of the switching elements Q1, Q2 serving as output elements are needed besides the power supply line (input voltage line) 51 of the input voltage Vin and the ground line 52.

Figure 1:
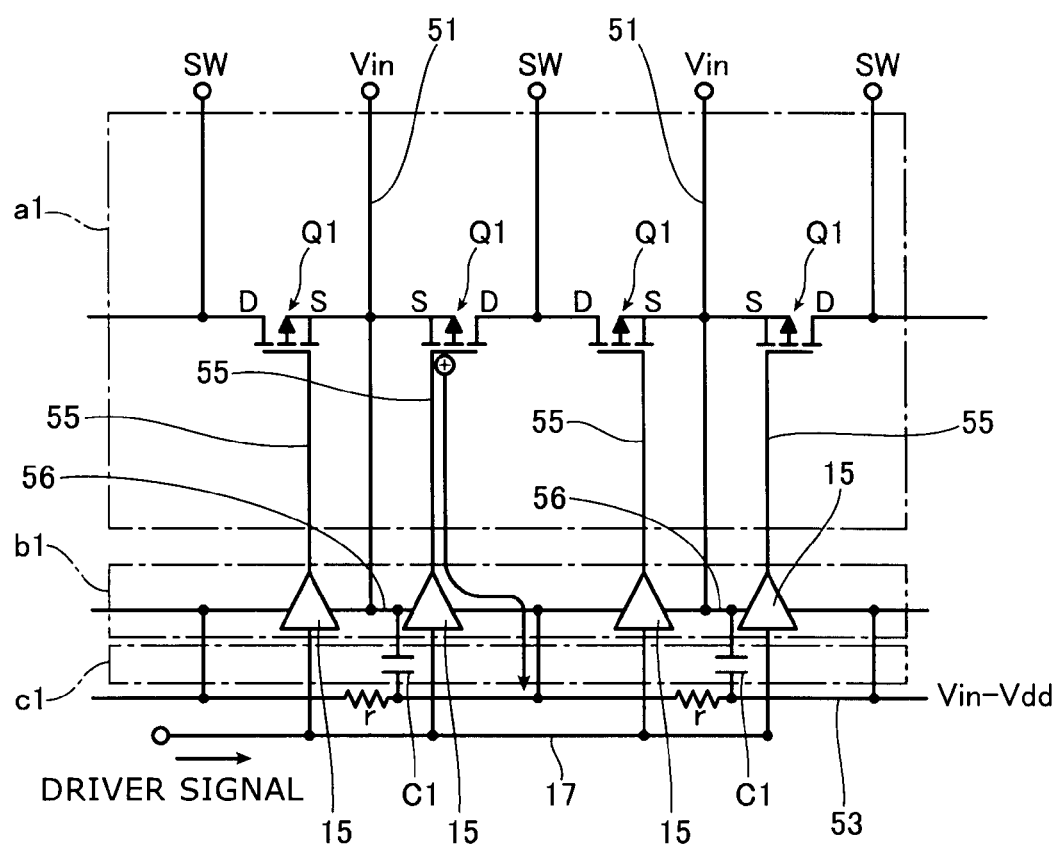
FIG. 1 is a circuit diagram of a high-side switching element and a driver circuit for driving the switching element in a semiconductor device according to an embodiment of the invention.

FIG. 1 shows a circuit configuration of the high-side switching element Q1 and a driver circuit 15 for driving the switching element Q1.

A plurality of switching elements Q1 are formed in one chip. Each source electrode is connected to the power supply line (input voltage line) 51 of the input voltage Vin, and each drain electrode is connected through the terminal SW to the inductor L shown in FIG. 2.

The driver circuit 15 is illustratively a CMOS, which is driven (turned on/off) by a driver driving signal supplied through a driver driving signal line 17. The driver circuit 15 is connected to a reference voltage line 56 and the power supply line 53 of the driver circuit 15, and the reference voltage line 56 is connected to the source electrode of the switching element Q1. Furthermore, the driver circuit 15 is connected to the gate electrode of the switching element Q1 through a gate driving signal line 55. The plurality of switching elements Q1, the plurality of driver circuits 15, the reference voltage line 56, and the power supply line 53 are formed in the same semiconductor substrate (one chip).

The input voltage Vin of the DC-DC converter in this embodiment is illustratively ten and several volts, which is higher than the breakdown voltage of the gate oxide film used in a typical CMOS. Hence, in the case where the switching element Q1 is of p-channel type, the gate is turned on/off using 0 volts to [voltage Vdd depending on the breakdown voltage of the gate oxide film], rather than 0 volts to Vin. The power supply line 53 of the driver circuit 15 is connected to a reference voltage source (regulator), not shown, and is supplied therefrom with a voltage of Vin−Vdd.

During the off-time of the high-side switching element Q1, the gate electrode is short-circuited to the input voltage line 51 through the driver circuit 15 and the gate driving signal line 55, and (positive) charges are injected into the gate electrode. During the on-time, (positive) charges are extracted from the gate electrode through the gate driving signal line 55 and the driver circuit 15 to the power supply line 53 of the driver circuit 15.

In this configuration, particularly if the operating current is increased, it is difficult to uniformly turn on/off the entirety of a plurality of switching elements Q1 due to the effect of interconnect resistance. Hence, on the semiconductor substrate, the formation region b1 of the driver circuits 15 is laid out in close proximity to the formation region a1 of the switching elements Q1. The input voltage line 51 is a current path through which a large current flows from the input terminal 11 to the inductor L, and hence is formed with a relatively large area to reduce interconnect resistance. The input voltage line 51 can be shared between the switching element Q1 and the driver circuit 15 to hold down the parasitic resistance of the interconnect path used for injecting charges, thereby facilitating injection of charges into the gate electrode of each switching element Q1.

However, the power supply line 53 of the driver circuit 15 is not shared with the switching element Q1, but dedicated to the driver circuit 15. This line is routed a long distance from a location (reference voltage source) located relatively remote from the switching element Q1, and is formed thinner than the input voltage line 51 from the viewpoint of restricting the increase of ineffective area in the chip. The power supply line 53 of the driver circuit 15 is a path for extracting positive charges from the gate electrode of the switching element Q1, and hence is affected by the parasitic interconnect resistance (labeled "r" in FIG. 1) during the on-time of the switching element Q1. In the power supply line 53, the desired voltage (Vin−Vdd) is held at a location near the reference voltage source (regulator), but approximates to Vin at a location far from the reference voltage source (regulator). Thus charges cannot be rapidly extracted from the switching element Q1 far from the reference voltage source (regulator), increasing the switching time and loss. That is, the turn-on characteristics of the plurality of switching elements Q1 are varied with the distance to the reference voltage source (regulator).

Hence, in this embodiment, a capacitor C1 is connected between the reference voltage line 56 connected to the source electrode of the switching element Q1 and the power supply line 53. The capacitor C1 is also formed in the same semiconductor substrate (semiconductor chip) as the switching elements Q1, the driver circuits 15, the reference voltage line 56, and the power supply line 53.

The high-side driver circuit formation region b1 is provided next to the high-side switching element formation region a1. A plurality of driver circuits 15 are arrayed longitudinally along the switching element formation region a1. The reference voltage line 56 and the power supply line 53 of the driver circuits extend in the longitudinal direction of the driver circuit formation region b1. The formation region c1 of the capacitor C1 is provided next to the driver circuit formation region b1. Thus the driver circuit formation region b1 is located between the switching element formation region a1 and the capacitor formation region c1. The longitudinal direction of the switching element formation region a1 generally coincides with the longitudinal direction of the driver circuit formation region b1, and a plurality of capacitors C1 are distributed along this direction.

During the on-time of the switching element Q1, charges on the capacitor C1 interposed between the reference voltage line 56 and the power supply line 53 instantaneously serve the same function as the reference voltage source (regulator) of the power supply line 53 and can alleviate the change of current flowing through the power supply line 53. As the current change in the power supply line 53 decreases, the resulting voltage drop also decreases. Hence the voltage Vin−Vdd can be held also at a location remote from the reference voltage source (regulator), which produces the reference voltage Vin−Vdd. Consequently, (positive) charges can be rapidly extracted also from the gate electrode of the switching element Q1 far from the reference voltage source (regulator). Thus it is possible to reduce the switching loss of the DC-DC converter, to enhance the conversion efficiency, and to achieve fast operation.

In the case where the switching element Q1 is of p-channel type, to hold the voltage Vin−Vdd uniformly throughout the extending direction of the power supply line 53 of the driver circuit 15 (the longitudinal direction of the switching element formation region a1 and the longitudinal direction of the driver circuit formation region b1), it is preferable to evenly distribute a plurality of capacitors C1 in the extending direction of the power supply line 53 as shown in FIG. 1. This is because a capacitor necessarily has parasitic resistance, which can be reduced by distributing the plurality of capacitors.

Next, a description is given of a simulation result of the current flowing through the switching element Q1 in the configuration of the above embodiment and in a configuration (comparative example) where the capacitor C1 is omitted therefrom.

Figure 3:
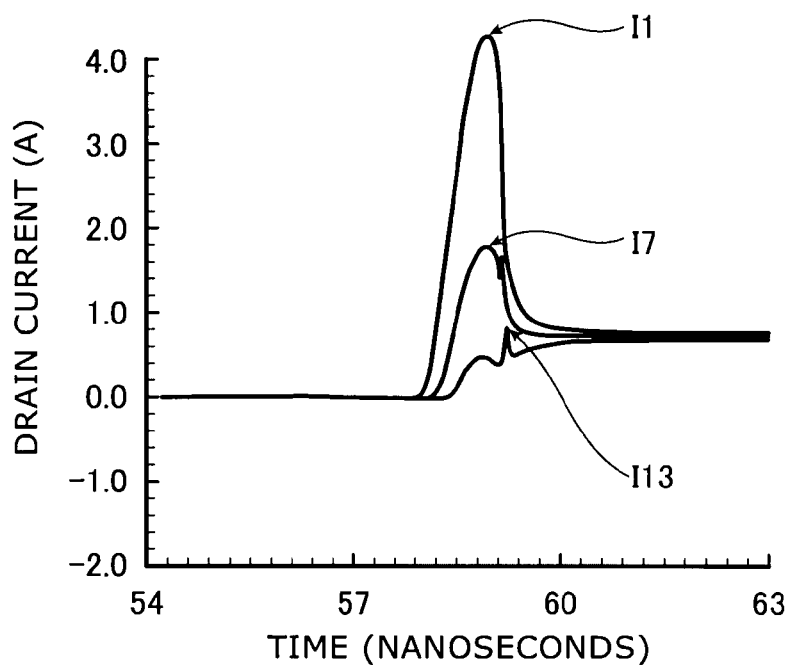
FIG. 3 is a graph showing the simulation result of a current flowing through a switching element of a comparative example in which a driver circuit is not provided with a capacitor.
Figure 4:
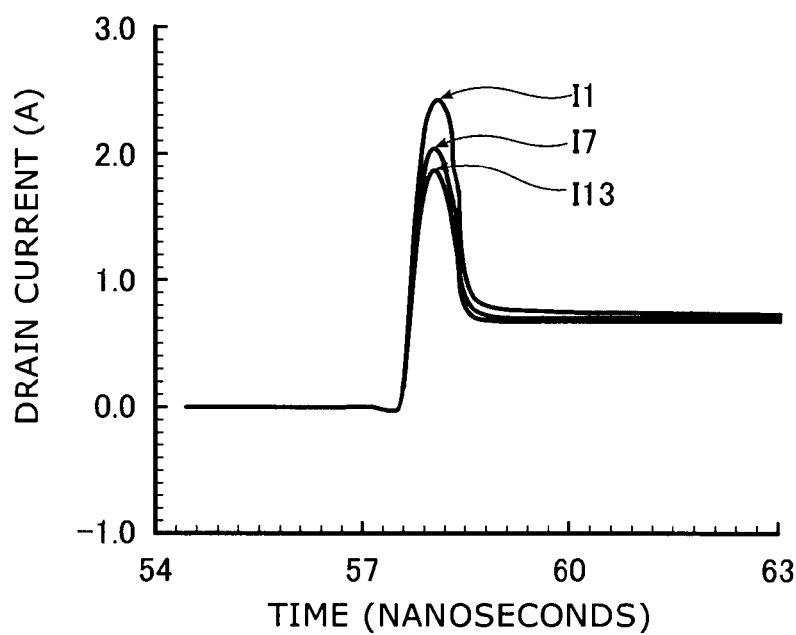
FIG. 4 is a graph showing the simulation result of a current flowing through the switching element of the semiconductor device according to the embodiment of the invention.

FIG. 3 is a graph showing the simulation result of the configuration of the comparative example, and FIG. 4 is a graph showing the simulation result of the configuration of the embodiment. A capacitor with a capacitance of 130 pF was connected between each of 13 separate switching elements (MOSFET) and a power supply line of the driver circuit connected thereto. The waveforms shown in FIGS. 3 and 4 are turn-on waveforms for the drain current of the high-side switching element Q1 of the DC-DC converter for an input voltage Vin of 12 V and an output current of 10 A.

Of the 13 switching elements Q1, the peak value of the drain current flowing through the switching element Q1 nearest to the reference voltage source (regulator) is denoted by I1, the peak value of the drain current flowing through the switching element Q1 seventh nearest thereto is denoted by I7, and the peak value of the drain current flowing through the switching element Q1 farthest therefrom is denoted by I13.

In the comparative example, as shown in FIG. 3, during switching-on, the peak value I1 of the drain current flowing through the switching element Q1 nearest to the reference voltage source (regulator) is 4.3 A, whereas the peak value I13 of the drain current flowing through the switching element Q1 farthest therefrom is 0.79 A. Thus the drain current greatly varies with the distance to the reference voltage source (regulator).

In this embodiment, as shown in FIG. 4, the peak value I1 of the drain current flowing through the switching element Q1 nearest to the reference voltage source (regulator) is 2.4 amperes, whereas the peak value I13 of the drain current flowing through the switching element Q1 farthest therefrom is 1.9 amperes, exhibiting a smaller variation than in the comparative example. That is, in this embodiment, the plurality of switching elements Q1 can be uniformly switched.

Figure 5:
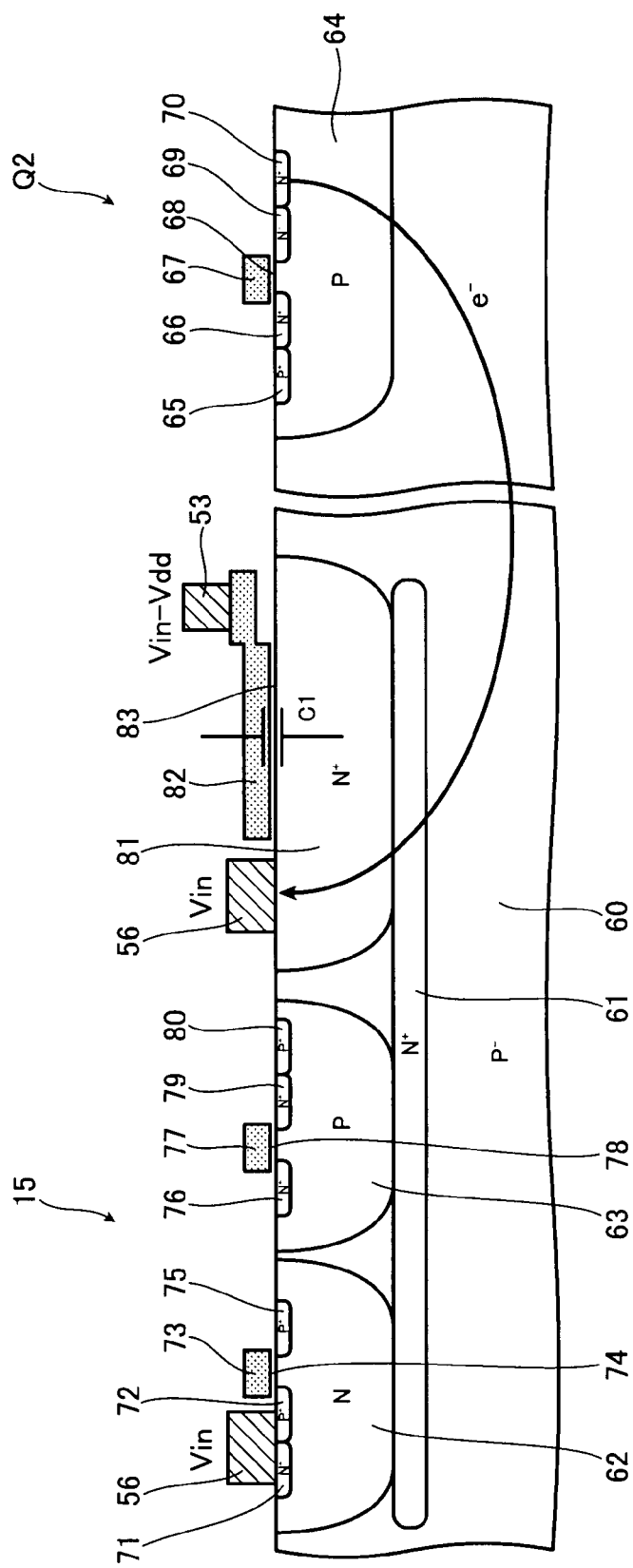
FIG. 5 is a schematic view showing the principal cross-sectional structure of the semiconductor device according to the embodiment of the invention.

FIG. 5 is a schematic view showing the principal cross-sectional structure of a semiconductor device according to the embodiment of the invention. The switching elements Q1, Q2 and the driver circuits 15, 25 described above are formed in the same $P^-$-type semiconductor substrate 60. It is noted that FIG. 5 shows the low-side switching element Q2 and the high-side driver circuit 15.

The low-side switching element Q2 is an N-channel MOSFET. A P-type base region (P-type well) 64 is formed in the formation region of the low-side switching element Q2 in the semiconductor substrate 60. An $N^+$-type source region 66, a $P^+$-type base contact region 65, an $N^+$-type drain region 70, and an $N^-$-type drift region 69 are selectively formed in the surface of the base region 64. The source region 66 and the base contact region 65 are connected to the ground line 52 in FIGS. 1 and 2, and the drain region 70 is connected to the terminal SW. Above the base region 64 located between the source region 66 and the drift region 69, a gate electrode 67 is provided via a gate insulating film 68.

Although not shown, in the formation region of the high-side switching element Q1 in the semiconductor substrate 60, a P-channel high-side switching element Q1 is formed, in which a $P^+$-type source/drain region is selectively formed in the surface of an N-type base region (N-type well).

An $N^+$-type buried layer 61 is formed in the formation region of the driver circuit in the semiconductor substrate 60, and a driver circuit 15 having the CMOS structure is formed thereon. More specifically, a P-channel MOSFET with $P^+$-type diffusion regions 72, 75 and an $N^+$-type base contact region 71 formed in the surface of an N-type base region (N-type well) 62, and an N-channel MOSFET with $N^+$-type diffusion regions 76, 79 and a $P^+$-type base contact region 80 formed in the surface of a P-type base region (P-type well) 63, are formed on the $N^+$-type buried layer 61.

The $P^+$-type diffusion region 72 and the base contact region 71 are connected to the reference voltage line 56, which is connected to the power supply line 51 of the input voltage Vin, and the $P^+$-type diffusion region 75 is connected to the gate electrode of the high-side switching element Q1. Above the base region 62 located between the $P^+$-type diffusion regions 72 and 75, a gate electrode 73 is provided via a gate insulating film 74.

The $N^+$-type diffusion region 79 and the base contact region 80 are connected to the power supply line 53 of the driver circuit 15, and the $N^+$-type diffusion region 76 is connected to the gate electrode of the high-side switching element Q1. Above the base region 63 located between the $N^+$-type diffusion regions 76 and 79, a gate electrode 77 is provided via a gate insulating film 78.

Furthermore, on the $N^+$-type buried layer 61, a deep $N^+$-type diffusion layer 81 is formed in contact therewith, and the reference voltage line 56 connected to the power supply line 51 of the input voltage Vin is connected to the $N^+$-type diffusion layer 81. Thus the potential of the $N^+$-type buried layer 61 is fixed to Vin, and a depletion layer is extended from the PN junction between the $N^+$-type buried layer 61 and the $P^-$-type semiconductor substrate 60, thereby isolating the driver circuit 15 from the semiconductor substrate 60.

Moreover, above the surface of the $N^+$-type diffusion layer 81, an electrode 82 made of e.g. polycrystalline silicon is provided via an insulating film (e.g. silicon oxide film) 83. The potential of the $N^+$-type diffusion layer 81 is fixed to Vin, and the electrode 82 is connected to the power supply line 53 and fixed to the potential Vin−Vdd. That is, a capacitor C1 with the $N^+$-type diffusion layer 81 and the electrode 82 serving as opposed electrodes is formed between the reference voltage line 56 and the power supply line 53.

The gate insulating films 74 and 78, and the insulating film 83 may be formed by a same material (silicon oxide, for example) and may have a same thickness so that these insulating films can be formed in a same formation step and thus the fabrication process becomes simplified.

Figure 11:
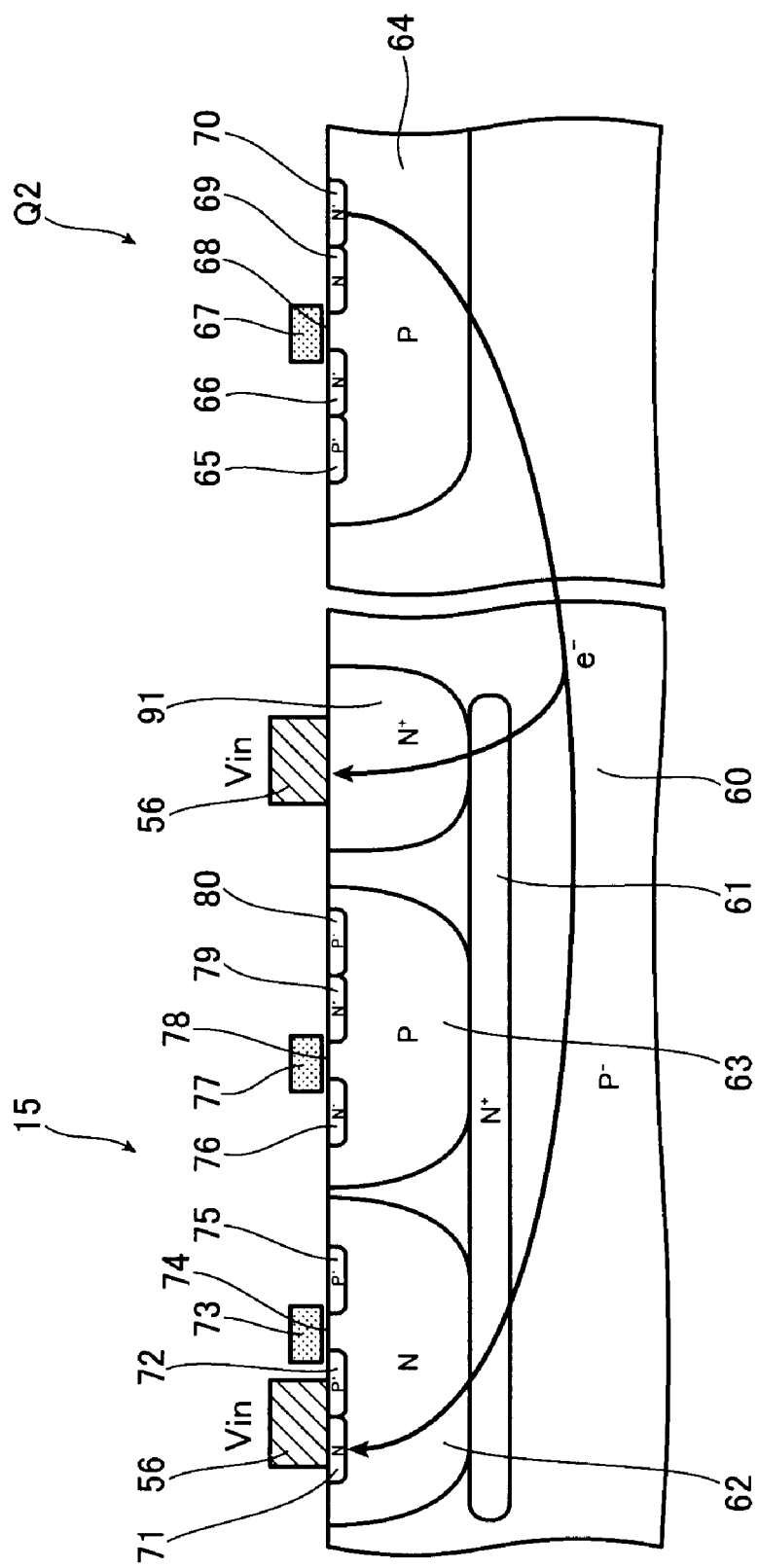
FIG. 11 is a schematic view showing the principal cross-sectional structure of the semiconductor device of the comparative example having no capacitor.

FIG. 11 is a schematic cross-sectional view, corresponding to FIG. 5, of a semiconductor device of the comparative example without the capacitor C1. The same components as those in FIG. 5 are labeled with like reference numerals.

In a DC-DC converter with no Schottky barrier diode 16 connected on the low side, during the dead time in which both the high-side and low-side switching element Q1, Q2 are turned on, the built-in body diode of the low-side switching element Q2 is activated, and electrons are injected from the $N^+$-type drain region 70 into the semiconductor substrate 60. The injected electrons are attracted toward the high potential, that is, the region connected to Vin. Hence the electrons injected into the semiconductor substrate 60 flow to the $N^+$-type diffusion layer 91 that serves to fix the potential of the $N^+$-type buried layer 61 to Vin. However, if the width (cross-sectional area) of the $N^+$-type diffusion layer 91 is narrow, some of the electrons also flow to the electrode that serves to fix the potential of the N-type well 62 of the PMOS in the driver circuit 15. This current may cause a latch-up. Once a latch-up occurs, gate driving loses control, resulting in device destruction.

In this embodiment, as described above with reference to FIG. 5, an electrode 82 is formed above the $N^+$-type diffusion layer 81 to provide a capacitor C1. Hence, by that amount, the width (cross-sectional area) of the $N^+$-type diffusion layer 81 can be increased. The increase of the width (cross-sectional area) of the $N^+$-type diffusion layer 81 results in decreasing the resistance of the $N^+$-type diffusion layer 81. Hence the above-described electrons injected from the low-side switching element Q2 into the semiconductor substrate 60 during the dead time are likely to be injected into the $N^+$-type diffusion layer 81, and are prevented from flowing into the driver circuit 15. Thus the malfunction and destruction of the driver circuit 15 can be prevented.

Figure 6:
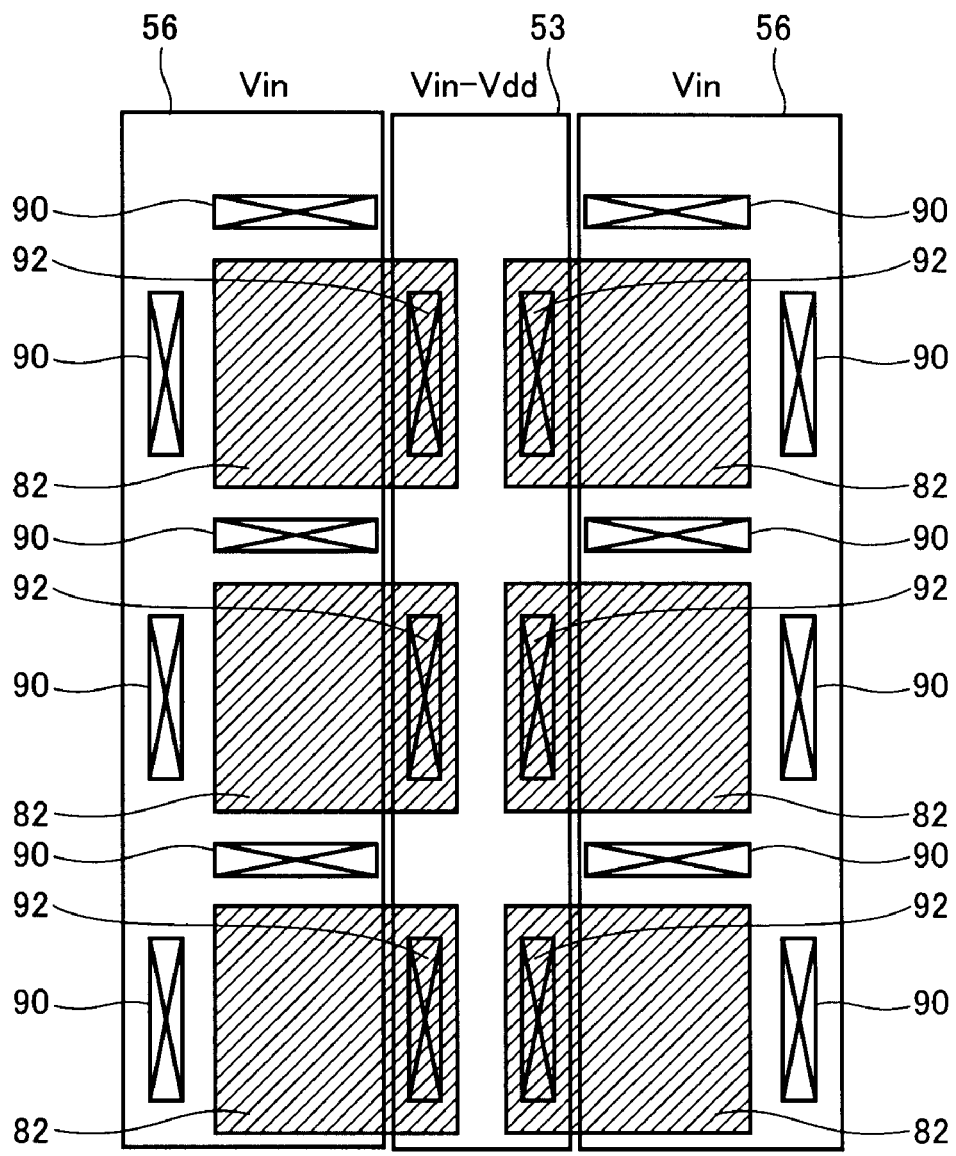
FIG. 6 is a schematic view showing the principal planar structure of the semiconductor device according to the embodiment of the invention.

FIG. 6 is a schematic view showing the planar layout of the electrode 82 in an example with the capacitors C1 being distributed.

The electrode 82 is divided into a plurality of pieces. Each electrode 82 is connected to the power supply line 53 of the driver circuit 15 through a contact layer 92. The $N^+$-type diffusion layer 81 is connected to the reference voltage line 56 through a contact layer 90. It is preferable to provide a plurality of contact layers 90 that connect between the $N^+$-type diffusion layer 81 and the reference voltage line 56. The reason is that it serves to decrease the resistance in the path where electrons injected into the substrate 60 plunge into the reference voltage line 56 through the diffusion layer 81 and the contact layer 90, and to prevent the electrons from plunging into the driver circuit 15.

It is noted that the capacitor C1 is not limited to the structure with a semiconductor layer ($N^+$-type diffusion layer 81)

opposed to the polycrystalline silicon electrode 82 across an insulating film. It is also possible to use a structure with a semiconductor layer opposed to a metal film across an insulating film, a structure with polycrystalline silicon layers opposed to each other across an insulating film, or a structure with metal films opposed to each other across an insulating film.

While the high-side switching element Q1 is a p-channel MOSFET in the above embodiment, it may alternatively be an n-channel MOSFET.

Figure 7:
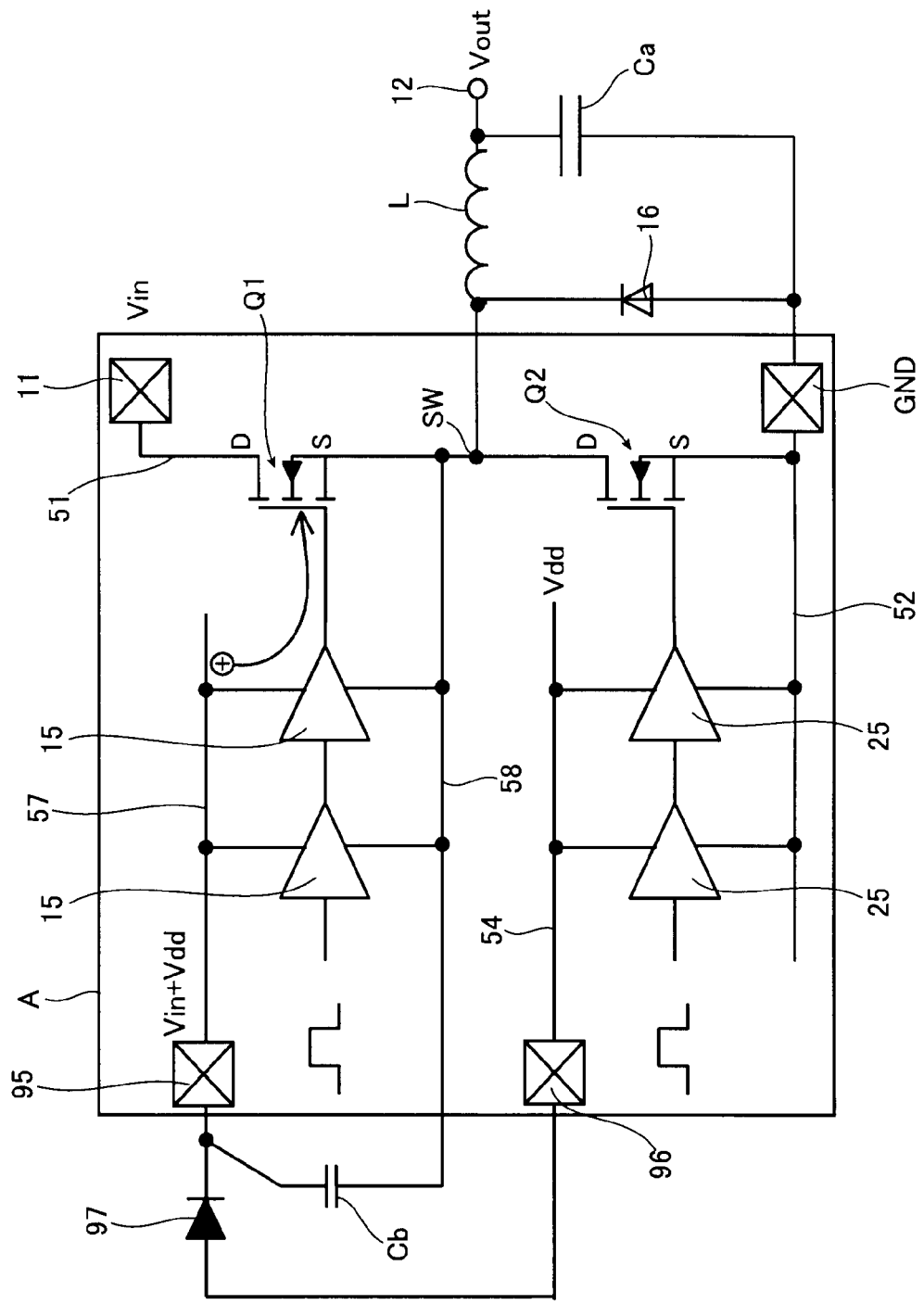
FIG. 7 is a circuit diagram illustrating the overall configuration of a DC-DC converter based on a semiconductor device according to another embodiment of the invention.

FIG. 7 is a circuit diagram illustrating the overall configuration of a DC-DC converter based on an n-channel switching element Q1.

Figure 8:
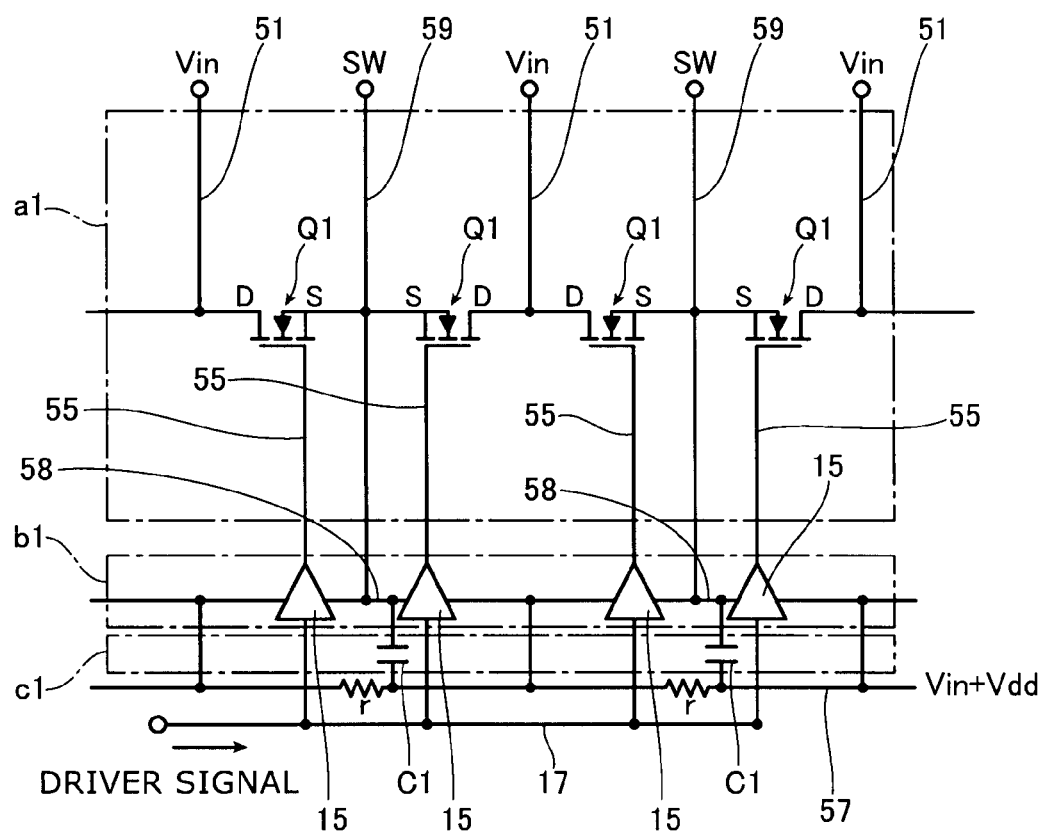
FIG. 8 is a circuit diagram of a high-side switching element and a driver circuit for driving the switching element in the semiconductor device according to another embodiment of the invention.

FIG. 8 shows a circuit configuration of the n-channel switching element Q1 and a driver circuit 15 for driving it.

In contrast to the p-channel MOSFET, in the case of the switching element Q1 of an n-channel MOSFET, the drain electrode thereof is connected to the input terminal 11 through the input voltage line 51, and the source electrode is connected to the inductor L through the terminal SW.

The driver circuit 15 for driving the switching element Q1 is connected to a power supply line 57 of the driver circuit 15 and a reference voltage line 58, which is connected to the source electrode of the switching element Q1. The power supply line 57 is connected to a reference voltage source (regulator), not shown, and is supplied with a voltage of Vin+Vdd.

A bootstrap diode 97 and a capacitor Cb are provided external to the semiconductor substrate (semiconductor chip) A in which the switching elements Q1, Q2, the driver circuits 15, 25 are formed. The anode of the bootstrap diode 97 is connected to the power supply line 54 of the low-side driver circuit 25 through the terminal 96, and the cathode is connected to the power supply line 57 of the high-side driver circuit 15 through the terminal 95. One end of the capacitor Cb is connected between the cathode of the bootstrap diode 97 and the terminal 95, and the other end is connected to the reference voltage line 58, which is connected to the source electrode of the switching element Q1.

When the switching element Q2 is turned on, the capacitor Cb is charged with the voltage Vdd through the bootstrap diode 97. When the switching element Q2 is turned off and the switching element Q1 is turned on, the potential difference of the capacitor Cb is held at Vdd with reference to the potential of the terminal SW, and the potential of the power supply line 57 of the high-side driver circuit 15 is held at Vin+Vdd. At this time, the bootstrap diode 97 is reverse biased, thereby isolating the power supply line 57 of the high-side driver circuit 15 from the power supply line 54 of the low-side driver circuit 25. This driving technique, called the bootstrap technique, is often used in a DC-DC converter where the high-side switching element Q1 is of n-channel type.

Like the p-channel switching elements, a plurality of n-channel switching elements Q1 are formed in one chip as shown in FIG. 8. The driver circuit 15 is connected to the gate electrode of the switching element Q1 through the gate driving signal line 55.

During the off-time of the switching element Q1, the gate electrode of the switching element Q1 is short-circuited through the gate driving signal line 55 and the driver circuit 15 to a switching line 59 connected to the source electrode of the switching element Q1 and the terminal SW, and thereby (positive) charges are discharged. During the on-time of the switching element Q1, the gate electrode is charged with (positive) charges from the power supply line 57 of the driver circuit through the driver circuit 15 and the gate driving signal line 55.

On the semiconductor substrate, the formation region b1 of the driver circuits 15 is laid out in close proximity to the formation region a1 of the switching elements Q1. Thus the switching line 59 formed with a relatively large area can be shared between the switching element Q1 and the driver circuit 15 to hold down the parasitic resistance of the interconnect path used for discharging charges, thereby facilitating discharging of charges from the gate electrode of each switching element Q1.

However, the power supply line 57 of the driver circuit 15 is not shared with the switching element Q1, but dedicated to the driver circuit 15. This line is routed a long distance from a location (reference voltage source) located relatively remote from the switching element Q1, and is formed thinner than the switching line 59 from the viewpoint of restricting the increase of ineffective area in the chip.

Hence, in this embodiment, a capacitor C1 is connected between the reference voltage line 58 connected to the switching line 59 and the power supply line 57 of the driver circuit. The capacitor C1 is also formed in the same semiconductor substrate (semiconductor chip) as the switching elements Q1, the driver circuits 15, the reference voltage line 58, and the power supply line 57.

During the on-time of the switching element Q1, charges on the capacitor C1 interposed between the reference voltage line 58 and the power supply line 57 instantaneously serve the same function as the reference voltage source (regulator) of the power supply line 57 and can alleviate the change of current flowing through the power supply line 57. As the current change in the power supply line 57 decreases, the resulting voltage drop also decreases. Hence the voltage Vin+Vdd can be held also at a location remote from the reference voltage source (regulator), which produces the reference voltage Vin+Vdd. Consequently, the gate electrode of the switching element Q1 far from the reference voltage source (regulator) can also be rapidly charged with (positive) charges. Thus it is possible to reduce the switching loss of the DC-DC converter, to enhance the conversion efficiency, and to achieve fast operation.

Figure 9:
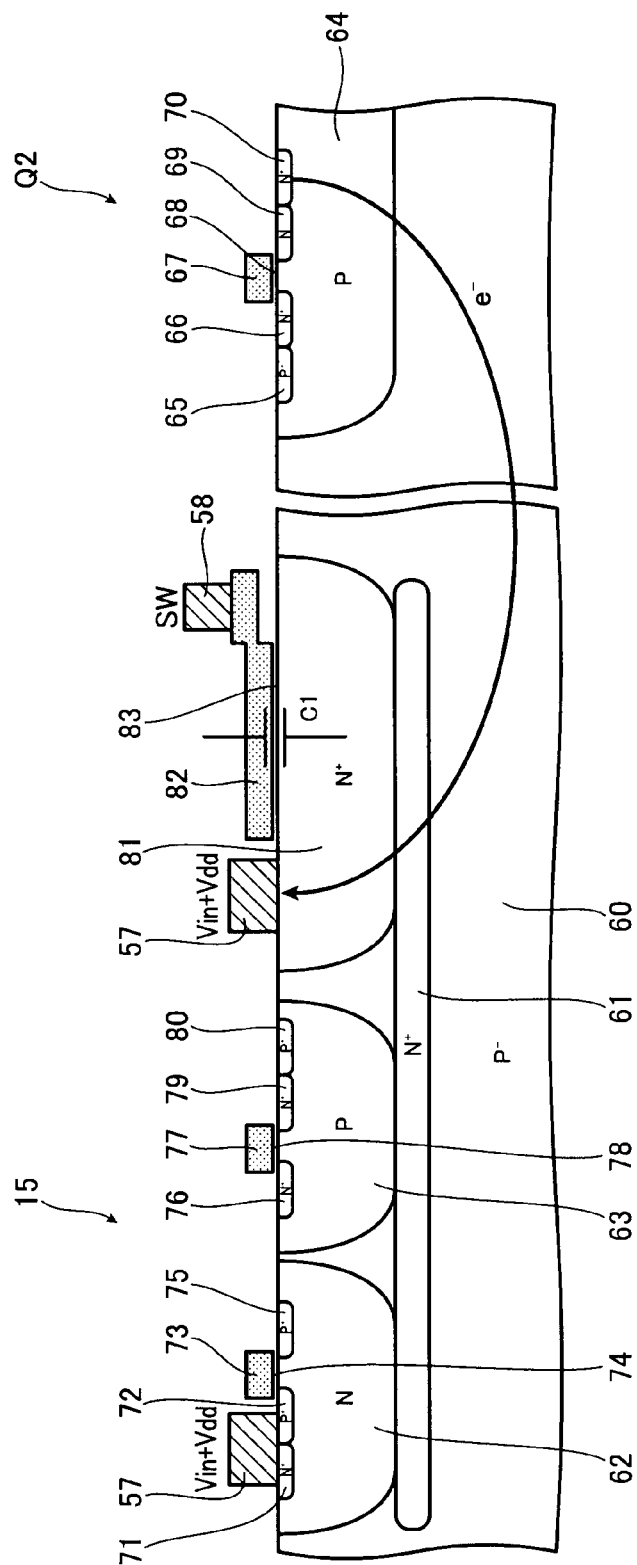
FIG. 9 is a schematic view showing the principal cross-sectional structure of the semiconductor device according to another embodiment of the invention.

FIG. 9 is a schematic cross-sectional view corresponding to FIG. 5, in the case where an n-channel MOSFET is used for the high-side switching element Q1. In FIG. 9, the same components as those in FIG. 5 are labeled with like reference numerals.

Above the surface of the $N^+$-type diffusion layer 81, an electrode 82 made of e.g. polycrystalline silicon is provided via an insulating film (e.g. silicon oxide film) 83 to form a capacitor C1 with the $N^+$-type diffusion layer 81 and the electrode 82 serving as opposed electrodes. The $N^+$-type diffusion layer 81 is connected to the power supply line 57 of the driver circuit 15, and its potential is set to Vin+Vdd. The electrode 82 is connected to the reference voltage line 58 connected to the terminal SW, and its potential is set to the potential of the terminal SW.

The gate insulating films 74 and 78, and the insulating film 83 may be formed by a same material (silicon oxide, for example) and may have a same thickness so that these insulating films can be formed in a same formation step and thus the fabrication process becomes simplified.

Also in this example, an electrode 82 is formed above the $N^+$-type diffusion layer 81 to provide a capacitor C1. Hence, by that amount, the width (cross-sectional area) of the $N^+$-type diffusion layer 81 can be increased. The increase of the width (cross-sectional area) of the $N^+$-type diffusion layer 81 results in decreasing the resistance of the $N^+$-type diffusion layer 81. Hence the above-described electrons injected from the low-side switching element Q2 into the semiconductor substrate 60 during the dead time are likely to be injected into the $N^+$-type diffusion layer 81, and are prevented from flowing into the driver circuit 15. Thus the malfunction and destruction of the driver circuit 15 can be prevented.

While the high side is described in the above embodiment, the low-side driver circuit may also be provided with a capacitor.

Figure 10:
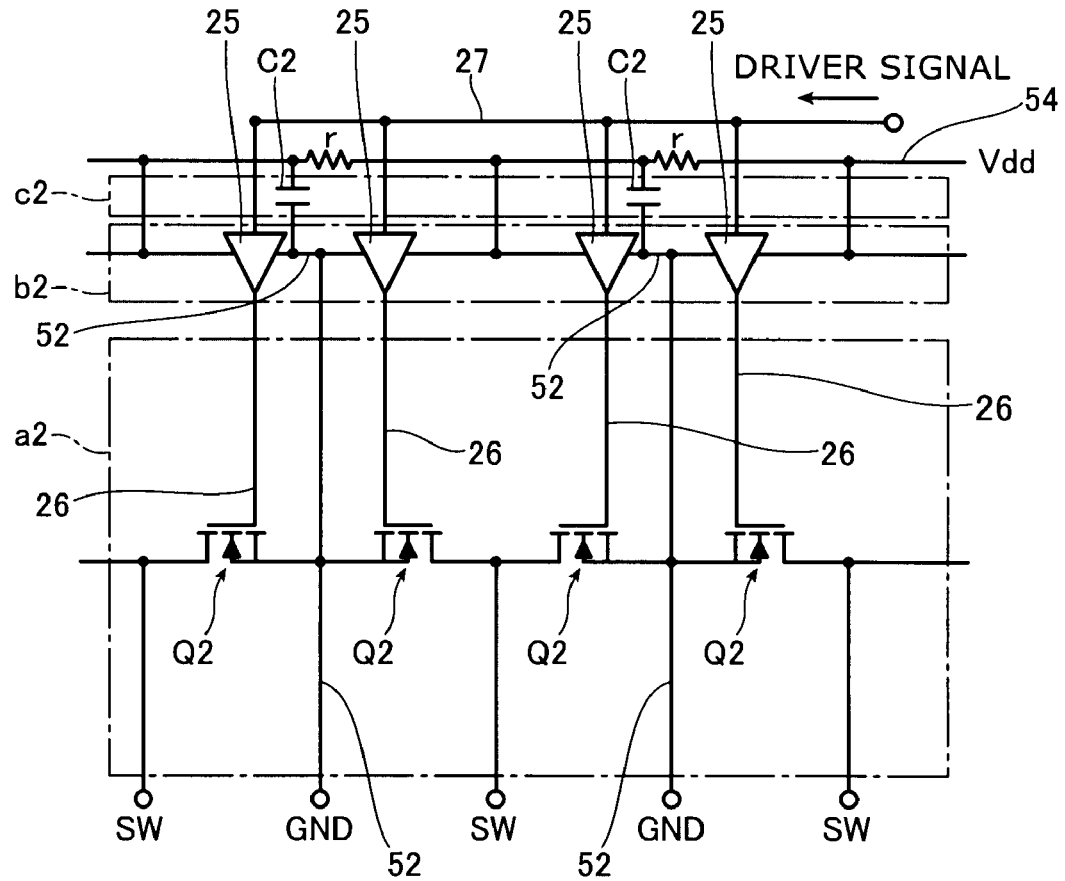
FIG. 10 is a circuit diagram of a low-side switching element and a driver circuit for driving the switching element in the semiconductor device according to the embodiment of the invention.

FIG. 10 shows a circuit configuration of the low-side switching element Q2 and a driver circuit 25 for driving the switching element Q2.

A plurality of switching elements Q2 are formed in one chip. Each source is connected to the ground line 52, and each drain is connected through the terminal SW to the inductor L shown in FIG. 2.

The driver circuit (CMOS) 25 is driven (turned on/off) by a driver driving signal supplied through a driver driving signal line 27. Each driver circuit 25 is connected to the ground line 52 and the power supply line 54 of the driver circuit 25. Furthermore, each driver circuit 25 is connected to the gate electrode of the switching element Q2 through a gate driving signal line 26. The power supply line 54 of the driver circuit 25 is connected to a reference voltage source (regulator), not shown, and is supplied therefrom with a voltage of Vdd.

On the low side, a capacitor C2 is connected between the ground line 52 and the power supply line 54 of the driver circuit 25. The capacitor C2 is formed in the same semiconductor substrate (semiconductor chip) as the switching elements Q2 and the driver circuits 25.

The low-side driver circuit formation region b2 is provided next to the low-side switching element formation region a2. A plurality of driver circuits 25 are arrayed longitudinally along the switching element formation region a2. The power supply line 54 of the driver circuits 25 extends in the longitudinal direction of the driver circuit formation region b2. The formation region c2 of the capacitor C2 is provided next to the driver circuit formation region b2. Thus the driver circuit formation region b2 is located between the switching element formation region a2 and the capacitor formation region c2. The longitudinal direction of the switching element formation region a2 generally coincides with the longitudinal direction of the driver circuit formation region b2, and a plurality of capacitors C2 are distributed along this direction.

During the on-time of the switching element Q2, charges on the capacitor C2 interposed between the ground line 52 and the power supply line 54 instantaneously serve the same function as the reference voltage source (regulator) of the power supply line 54 and can alleviate the change of current flowing through the power supply line 54. As the current change in the power supply line 54 decreases, the resulting voltage drop also decreases. Hence the voltage Vdd can be held also at a location remote from the reference voltage source (regulator), which produces the reference voltage Vdd. Consequently, (positive) charges can be rapidly extracted also from the gate electrode of the switching element Q2 far from the reference voltage source (regulator). Thus it is possible to reduce the switching loss of the DC-DC converter, to enhance the conversion efficiency, and to achieve fast operation.

Figure 12:
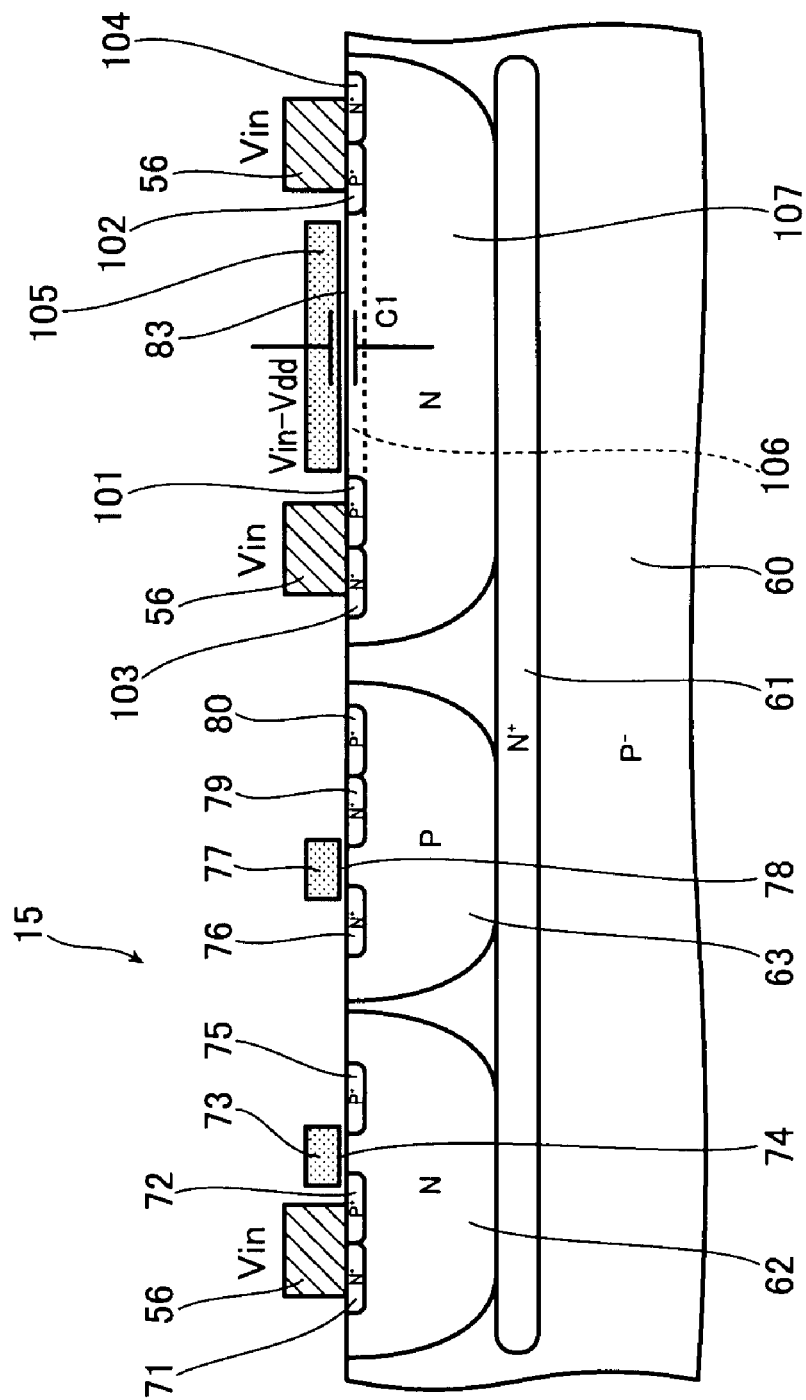
FIG. 12 is a schematic view showing the principal cross-sectional structure of a semiconductor device according to still another embodiment of the invention.

FIG. 12 is a schematic view showing the principal cross-sectional structure of a semiconductor device according to another embodiment of the invention. The same components as those described above with reference to FIG. 5 are labeled with like reference numerals. The formation region of the driver circuit in the semiconductor substrate 60 is configured like the above embodiment. The difference is in the portion where the capacitor C1 is formed.

On the $N^+$-type buried layer 61 is formed the same structure as the P-channel MOSFET with $P^+$-type diffusion regions 101, 102 and $N^+$-type base contact regions 103, 104 formed in the surface of an N-type base region (N-type well) 107. An electrode 105 made of e.g. polycrystalline silicon and provided above the N-type base region 107 via an insulating film 83 serves as a gate electrode.

The $P^+$-type diffusion regions 101, 102 and the $N^+$-type base contact regions 103, 104 are all connected to the reference voltage line 56. The electrode 105 is connected to the power supply line 53 of the driver circuit and fixed to a voltage of Vin–Vdd. Here, an inversion layer 106 is formed at the surface of the N-type base region 107 directly below the electrode 105. That is, in this embodiment, a capacitor C1 with the inversion layer 106 and the electrode 105 serving as opposed electrodes is formed between the reference voltage line 56 and the power supply line 53.

The N-type base region 107 can be formed in the same process as the N-type base region 62 of the driver circuit. The $N^+$-type base contact regions 103, 104 can be formed in the same process as the $N^+$-type diffusion regions 71, 76, 79 of the driver circuit. The $P^+$-type diffusion regions 101, 102 can be formed in the same process as the $P^+$-type diffusion regions 72, 75, 80 of the driver circuit. The electrode 105 can be formed in the same process as the electrodes 73, 77 of the driver circuit. The reference voltage line 56 can also be formed in the same process as the driver circuit. That is, this embodiment allows the driver circuit and the capacitor C1 to be formed in a common process, and can omit the step of forming the $N^+$-type diffusion layer 81, which is otherwise performed besides the step of forming the driver circuit in FIG. 5.

The invention claimed is:

1. A semiconductor device comprising, in one semiconductor substrate:
    a plurality of switching elements connected between a terminal of an input voltage and an inductor;
    a driver circuit connected to a gate electrode of each said switching element and driving each said switching element;
    a reference voltage line connected to a source electrode of each said switching element;
    a power supply line of the driver circuit; and
    at least one capacitor connected between the power supply line and the reference voltage line,
    wherein the at least one capacitor includes a plurality of capacitors distributed along a longitudinal direction of a formation region of the switching elements in the semiconductor substrate.

2. The semiconductor device according to claim 1, wherein the capacitor includes:
    a semiconductor layer formed in a superficial portion of the semiconductor substrate,
    an insulating film provided on a surface of the semiconductor layer, and
    an electrode provided on the insulating film and opposed to the semiconductor layer.

3. The semiconductor device according to claim 1, wherein a formation region of the driver circuit is provided between a formation region of the switching elements and a formation region of the capacitor.

4. The semiconductor device according to claim 1, wherein the at least one capacitor includes a plurality of capacitors distributed in the extending direction of the power supply line of the driver circuit.

5. The semiconductor device according to claim 1, wherein the substrate includes:
- a buried layer of a first conductivity-type provided inside the semiconductor substrate;
- a diffusion layer of the first conductivity-type provided between a surface of the semiconductor substrate and the buried layer;
- a base region of the first conductivity-type selectively provided on the buried layer; and
- a base region of a second conductivity-type selectively provided on the buried layer, wherein
- the driver circuit is formed on surfaces of the base regions of the first conductivity-type and the second conductivity-type, and
- the capacitor is formed on the diffusion layer.

6. The semiconductor device according to claim 5, wherein the capacitor includes the diffusion layer, an insulating film provided on the diffusion layer, and an electrode provided on the insulating film.

7. The semiconductor device according to claim 6, wherein:
- the diffusion layer is electrically short-circuited to the reference voltage line,
- the electrode is electrically short-circuited to the power supply line of the driver circuit, and
- the plurality of switching elements are P-channel MOSFETs.

8. The semiconductor device according to claim 6, wherein:
- the diffusion layer is electrically short-circuited to the power supply line,
- the electrode is electrically short-circuited to the reference voltage line, and
- the plurality of switching elements are N-channel MOSFETs.

9. The semiconductor device according to claim 5, wherein a formation region of the driver circuit is provided between a formation region of the switching elements and a formation region of the capacitor.

10. The semiconductor device according to claim 5, wherein the capacitor includes a plurality of capacitor pieces, and the capacitor pieces are provided along an extending direction of the power supply line of the driver circuit.

11. A semiconductor device comprising, in one semiconductor substrate:
- a plurality of switching elements connected between an inductor and a ground line;
- a driver circuit connected to a gate electrode of each said switching element and driving each said switching element;
- a power supply line of the driver circuit; and
- at least one capacitor connected between the power supply line and the ground line,
- wherein the at least one capacitor includes a plurality of capacitors distributed along the longitudinal direction of a formation region of the switching elements in the semiconductor substrate.

12. The semiconductor device according to claim 11, wherein the capacitor includes:
- a semiconductor layer formed in a superficial portion of the semiconductor substrate,
- an insulating film provided on a surface of the semiconductor layer, and
- an electrode provided on the insulating film and opposed to the semiconductor layer.

13. The semiconductor device according to claim 11, wherein a formation region of the driver circuit is provided between a formation region of the switching elements and a formation region of the capacitor.

14. The semiconductor device according to claim 11, wherein the at least one capacitor includes a plurality of capacitors distributed in the extending direction of the power supply line of the driver circuit.

15. A semiconductor device comprising, in one semiconductor substrate:
- a plurality of high-side switching elements connected between a terminal of an input voltage and an inductor;
- a high-side driver circuit connected to a gate electrode of each said high-side switching element and driving each said high-side switching element;
- a high-side reference voltage line connected to a source electrode of each said high-side switching element;
- a high-side power supply line of the high-side driver circuit;
- at least one high-side capacitor connected between the high-side power supply line and the high-side reference voltage line;
- a plurality of low-side switching elements connected between the inductor and a ground line;
- a low-side driver circuit connected to a gate electrode of each said low-side switching element and driving each said low-side switching element;
- a low-side power supply line of the low-side driver circuit; and
- at least one low-side capacitor connected between the low-side power supply line and the ground line,
- wherein
- the at least one high-side capacitor includes a plurality of high-side capacitors distributed along the longitudinal direction of a formation region of the high-side switching elements in the semiconductor substrate, and
- the at least one low-side capacitor includes a plurality of low-side capacitors distributed along the longitudinal direction of a formation region of the low-side switching elements in the semiconductor substrate.

16. The semiconductor device according to claim 15, wherein:
- the high-side capacitor includes a first semiconductor layer formed in a superficial portion of the semiconductor substrate, a first insulating film provided on a surface of the first semiconductor layer, and a first electrode provided on the first insulating film and opposed to the first semiconductor layer, and
- the low-side capacitor includes a second semiconductor layer formed in a superficial portion of the semiconductor substrate, a second insulating film provided on a surface of the second semiconductor layer, and a second electrode provided on the second insulating film and opposed to the second semiconductor layer.

* * * * *